United States Patent
Chuan et al.

(10) Patent No.: US 12,394,642 B2
(45) Date of Patent: Aug. 19, 2025

(54) APPARATUS FOR TRANSFERRING ELECTRONIC COMPONENT, METHOD FOR TRANSFERRING ELECTRONIC COMPONENT AND MANUFACTURING METHOD OF LIGHT-EMITTING DIODE PANEL

(71) Applicant: Micraft System Plus Co., Ltd.

(72) Inventors: Kuo-Pin Chuan, Taichung (TW); Sheng-Che Huang, Taichung (TW); Shu-Hsien Huang, Taichung (TW)

(73) Assignee: Micraft System Plus Co., Ltd., Taoyuan (TW)

( * ) Notice: Subject to any disclaimer, the term of this patent is extended or adjusted under 35 U.S.C. 154(b) by 602 days.

(21) Appl. No.: 17/744,753

(22) Filed: May 16, 2022

(65) Prior Publication Data

US 2023/0030227 A1    Feb. 2, 2023

Related U.S. Application Data

(60) Provisional application No. 63/227,340, filed on Jul. 30, 2021.

(30) Foreign Application Priority Data

Oct. 28, 2021    (TW) ................ 110140161

(51) Int. Cl.
*H01L 21/67* (2006.01)
*H01L 21/683* (2006.01)
(Continued)

(52) U.S. Cl.
CPC .... *H01L 21/67132* (2013.01); *H01L 21/6835* (2013.01); *H01L 24/80* (2013.01);
(Continued)

(58) Field of Classification Search
CPC .......... H01L 21/67132; H01L 21/6835; H01L 24/80; H01L 25/167
See application file for complete search history.

(56) References Cited

U.S. PATENT DOCUMENTS 8,499,813 B2 * 8/2013 Chien ............... H01L 21/67132
156/707
8,715,457 B2 * 5/2014 Behler .............. H01L 21/67132
156/707
(Continued)

FOREIGN PATENT DOCUMENTS

| CN | 102044404 | 5/2011 |
|----|-----------|--------|
| CN | 112055890 | 12/2020 |
| TW | 202022929 | 6/2020 |

OTHER PUBLICATIONS

"Office Action of Taiwan Counterpart Application", issued on Sep. 28, 2022, p. 1-p. 4.

*Primary Examiner* — Nathan W Ha
(74) *Attorney, Agent, or Firm* — JCIPRNET (57) ABSTRACT

An apparatus for transferring an electronic component is configured to transfer an electronic component on a flexible carrier to a target substrate. The apparatus includes a first frame, a second frame, an abutment module, an actuator, and a negative pressure generating device. The abutment module includes an abutting component and a guide. The guide guides a movement of the abutting component. The actuator actuates the abutment module so that the abutting component and the guide are respectively moved between a start position and an end position of an abutment path. The negative pressure generating device is pumped through the abutment module. When the abutment module abuts against the flexible carrier, a negative pressure is generated between the abutment module and the flexible carrier by the negative pressure generating device. The abutting component and the (Continued)

guide are moved simultaneously in at least a portion of the abutment path.

4 Claims, 7 Drawing Sheets

(51) Int. Cl.
    *H01L 23/00*     (2006.01)
    *H01L 25/16*     (2023.01)

(52) U.S. Cl.
    CPC ............ *H01L 25/167* (2013.01); *H01L 24/05* (2013.01); *H01L 24/08* (2013.01); *H01L 2221/68372* (2013.01); *H01L 2224/05553* (2013.01); *H01L 2224/05573* (2013.01); *H01L 2224/08145* (2013.01); *H01L 2224/80006* (2013.01); *H01L 2224/80801* (2013.01)

(56) References Cited

U.S. PATENT DOCUMENTS

| | | | |
|---|---|---|---|
| 10,573,543 B2 * | 2/2020 | Hussell | H01L 25/0753 |
| 11,270,897 B2 * | 3/2022 | Hussell | H01L 25/0753 |
| 11,594,432 B2 * | 2/2023 | Minnich | H01L 21/67132 |
| 11,784,159 B2 * | 10/2023 | Yang | H01L 24/75 |
| | | | 438/28 |
| 2011/0084377 A1 * | 4/2011 | Chien | H01L 25/0657 |
| | | | 257/E23.068 |
| 2012/0145332 A1 * | 6/2012 | Chien | H01L 21/67132 |
| | | | 156/758 |
| 2019/0333791 A1 * | 10/2019 | Hussell | H01L 21/6835 |
| 2020/0194288 A1 * | 6/2020 | Hussell | H01L 25/0753 |
| 2022/0020619 A1 * | 1/2022 | Liao | H01L 21/67103 |
| 2022/0223460 A1 * | 7/2022 | Huang | H01L 21/6838 |
| 2023/0142207 A1 * | 5/2023 | Lin | H01L 21/67766 |
| | | | 414/222.01 |
| 2024/0203934 A1 * | 6/2024 | Lin | H01L 21/6835 |

* cited by examiner

APPARATUS FOR TRANSFERRING ELECTRONIC COMPONENT, METHOD FOR TRANSFERRING ELECTRONIC COMPONENT AND MANUFACTURING METHOD OF LIGHT-EMITTING DIODE PANEL

CROSS-REFERENCE TO RELATED APPLICATION

This application claims the priority benefit of U.S. provisional application Ser. No. 63/227,340, filed on Jul. 30, 2021 and Taiwan application serial no. 110140161, filed on Oct. 28, 2021. The entirety of each of the above-mentioned patent applications is hereby incorporated by reference herein and made a part of this specification.

BACKGROUND

Technical Field

The disclosure relates to an apparatus for transferring an electronic component and a method for transferring an electronic component, and a manufacturing method of a light-emitting diode panel.

Description of Related Art

In a manufacturing process of an electronic product, the process usually includes related steps of transferring an electronic component. For example, in a manufacturing process of an LED display, a light-emitting diode is commonly placed on a TFT array substrate first through a pick-and-place apparatus. Then, the light-emitting diode on the TFT array substrate is fixed and electrically connected to the TFT array substrate. However, the throughput or the yield of the method above may be relatively low.

SUMMARY

The disclosure provides an apparatus for transferring an electronic component and a method for transferring an electronic component configured to transfer an electronic component.

An apparatus for transferring an electronic component is configured to transfer an electronic component on a flexible carrier to a target substrate. The apparatus for transferring the electronic component includes a first frame, a second frame, an abutment module, an actuator, and a negative pressure generating device. The first frame is configured to carry the flexible carrier. The second frame is configured to carry the target substrate so that the target substrate is disposed opposite to the flexible carrier. The abutment module is disposed adjacent to the first frame. The abutment module includes an abutting component and a guide. The guide may guide a movement of the abutting component. The actuator is configured to actuate the abutment module so that the abutting component and the guide of the abutment module may be respectively moved between a start position and an end position of an abutment path. The negative pressure generating device may be pumped through the abutment module. When the abutment module abuts against the flexible carrier, a negative pressure may be generated between the abutment module and the flexible carrier by the negative pressure generating device. The abutting component and the guide of the abutment module are simultaneously moved in at least a portion of the abutment path.

A method for transferring an electronic component includes the following. A flexible carrier is provided, and an electronic component is carried on a surface of the flexible carrier. A target substrate is provided such that the surface of the flexible carrier with the electronic component is disposed opposite to the target substrate. A first abutting surface and a second abutting surface respectively moving toward a surface of the flexible carrier without carrying the electronic component are provided, and an area of the first abutting surface is greater than an area of the second abutting surface. The first abutting surface and the second abutting surface are moved so that at least the second abutting surface contacts the surface of the flexible carrier without carrying the electronic component. The electronic component abuts against the target substrate, and a space is formed between the flexible carrier and the first abutting surface. A negative pressure is generated in the space. The second abutting surface leaves the flexible carrier.

A manufacturing method of a light-emitting diode panel includes adopting the method above to transfer a light-emitting diode to a panel.

Based on the above, the apparatus for transferring the electronic component and the method for transferring the electronic component of the disclosure are adapted to transfer the electronic component on the flexible carrier to the target substrate.

DESCRIPTION OF THE EMBODIMENTS

Contents of the following embodiments serve for describing instead of limiting. In addition, description of well-known apparatuses, methods, and materials may be omitted so as not to obscure the description of various principles of the disclosure. Directional terms are used herein (e.g., above, below, top, bottom) only with reference to the drawings or in correspondence to conventional terminology, and are not intended to imply absolute orientations. In addition, unless the content clearly dictates otherwise, the singular forms "a," "an," "the," or forms that do not specifically refer to a quantity may include one or plural forms, i.e., include "at least one."

In some of the drawings, some elements or film layers may be enlarged, reduced, or omitted for clarity. Similar components are denoted by the same reference numerals, and have similar functions, materials, or forming manners, and descriptions are omitted. It will be apparent to those of ordinary skill in the art to which the disclosure pertains, from the content of the embodiments and the corresponding illustrations, that the disclosure may be practiced in other embodiments that depart from the specific details disclosed herein.

Figure 1:
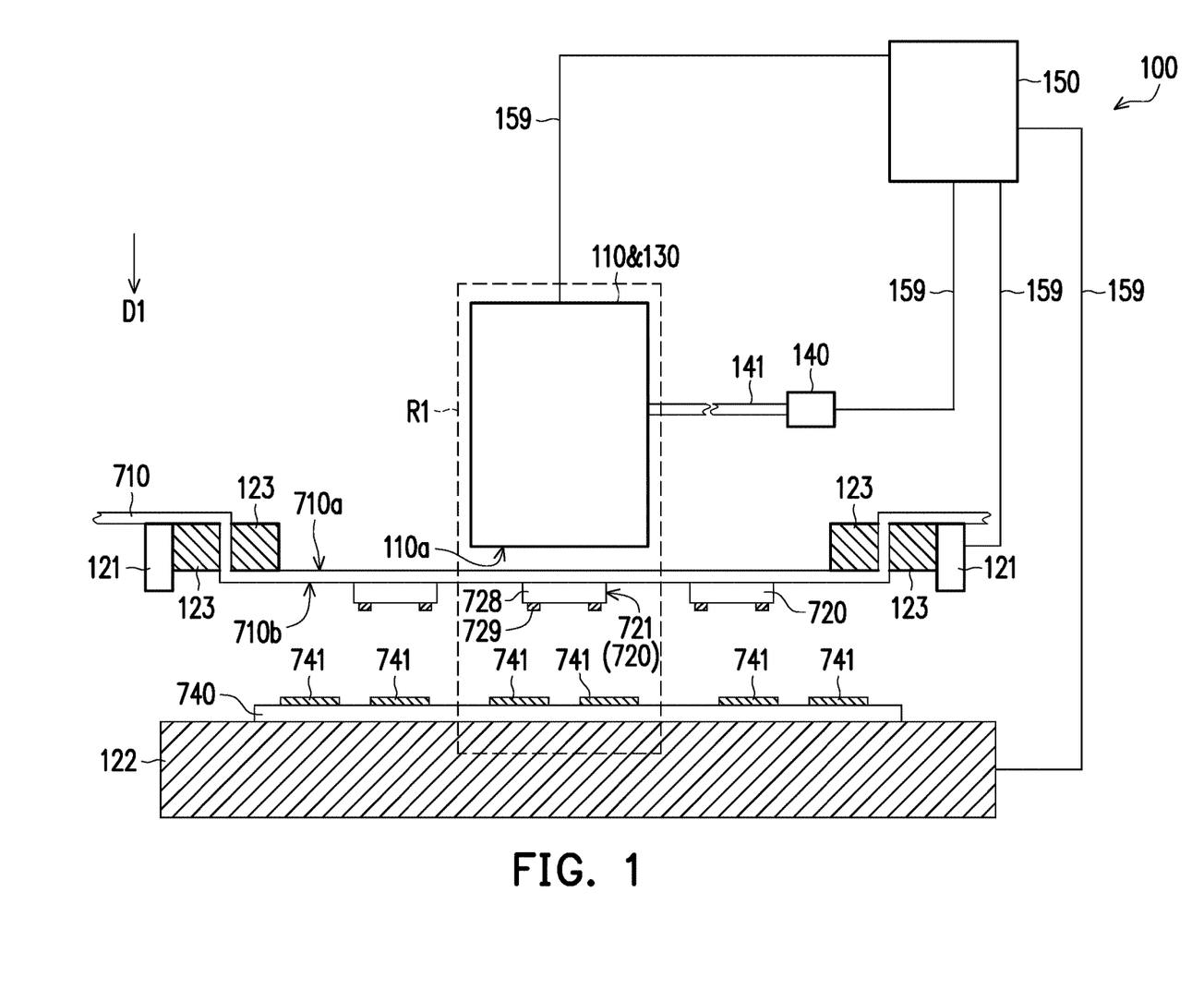
FIG. 1 is a schematic partial side view of a portion of an action of an apparatus for transferring an electronic component according to an embodiment of the disclosure.

Referring to FIG. 1, an apparatus 100 for transferring an electronic component (also briefly referred to as an electronic component transfer apparatus 100) may be adapted to transfer an electronic component 720 from a flexible carrier 710 to a target substrate 740 (as described in detail below). The apparatus 100 for transferring the electronic component includes a first frame 121, a second frame 122, an abutment module 110 (marked in FIG. 2), an actuator 130 (marked in FIG. 2), and a negative pressure generating device 140. The first frame 121 is configured to carry the flexible carrier 710. The second frame 122 is configured to carry the target substrate 740. The second frame 122 may cause the target substrate 740 to be disposed opposite to the flexible carrier 710. The abutment module 110 is disposed adjacent to the first frame 121. The actuator 130 may be configured to actuate the abutment module 110. The negative pressure generating device 140 may be pumped through the abutment module 110. Detailed structures of the abutment module 110, the actuator 130, and/or the negative pressure generating device 140 and/or corresponding actions therebetween are described in detail below.

In the embodiment, the apparatus 100 for transferring the electronic component may further include a control system 150. The control system 150 may be signally connected to a corresponding component, element, or unit (such as, but not limited to, the first frame 121, the second frame 122, the actuator 130, and/or the negative pressure generating device 140) in a manner of wired signal transmission through a corresponding signal wire 159; however, the disclosure is not limited thereto. In an embodiment, the control system 150 may be signally connected to the corresponding component, element, or unit in a manner of wireless signal transmission. That is, the apparatus 100 for transferring the electronic component including the control system 150 and the first frame 121, the second frame 122, the actuator 130, and/or the negative pressure generating device 140 signally connected to the control system 150 is the same equipment or machine. In addition, signal connection mentioned in the disclosure may refer to a connection method of wired signal transmission or wireless signal transmission. Furthermore, the disclosure is not intended to limit whether all the signal connection methods need to be the same or different.

In the embodiment, a material of the first frame 121 may include metal, glass, or plastic; however, the disclosure is not limited thereto. In an embodiment, the first frame 121 may include a corresponding fixing member (such as, but not limited to, a clamp and/or a clip) to be adapted to directly and/or indirectly fix the flexible carrier 710. For example, the first frame 121 may indirectly fix the flexible carrier 710 through a carrier frame 123. For example, at a position where the first frame 121 and the flexible carrier 710 are in contact, the flexible carrier 710 may be directly fixed through fiction between the first frame 121 and the flexible carrier 710 or in other suitable manner.

In an embodiment, the first frame 121 may include a corresponding transmission member (such as, but not limited to, a roller) to convey the the flexible carrier 710 along an appropriate direction. It is worth noting that the fixing member and the transmission member may be the same component or different components. For example, the flexible carrier 710 may be sandwiched between two rollers. In a state where the rollers are not rotated, the flexible carrier 710 may be fixed correspondingly. In a state where the rollers are rotated, the flexible carrier 710 may be conveyed correspondingly.

In an embodiment, the first frame 121 may be fixed or mounted on a movable unit. In this way, the first frame 121 may be moved and/or rotated along a corresponding direction according to design requirements. The movable unit may include a movable module (e.g. a horizontal movement module, a vertical movement module, a rotary movement module, or a combination of the above) commonly used in a design of a movable mechanism, and corresponding hardware or software may be included therein, or an auxiliary member may be further combined. For example, the movable module may have a power supply device, a motor, a belt, a gear, and other related elements, which is not limited in the disclosure. The related elements include, for example, communication elements, power elements, and the like, which is not limited in the disclosure. The software includes, for example, spatial position computing software, error recording software, communication software, and the like, which is not limited in the disclosure. The auxiliary member includes, for example, a moving rail, a moving shaft, a damping element, a positioning device, and the like, which is not limited in the disclosure.

In the embodiment, the flexible carrier 710 may include an ultraviolet tape (UV tape) or a blue tape, but the disclosure is not limited thereto. In an embodiment, the carrier frame 123 may be referred to as a blue tape frame, but the disclosure is not limited thereto.

In an embodiment, the flexible carrier 710 may be a composite material. For example, the flexible carrier 710 may have a polymer film or ultra-thin glass covered with an adhesive layer.

In the embodiment, the flexible carrier 710 may have a first surface 710a and a second surface 710b opposite to the first surface 710a. The electronic component 720 may be located on the second surface 710b of the flexible carrier 710 (e.g. the lower part in the drawings). The second surface 710b of the flexible carrier 710 may be disposed opposite to the target substrate 740.

In the embodiment, the electronic component 720 may include a die 728 and a conductive connection member 729 disposed on the die 728; however, the disclosure is not limited thereto. The die 728 may include a light-emitting die (such as, but not limited to, a light-emitting diode die) or an integrated circuit (IC); however, the disclosure is not limited thereto. In an embodiment, the conductive connection member 729 includes, for example, solder, but the disclosure is not limited thereto.

In an embodiment, a material of the second frame 122 may include metal, plastic, or other material suitable for supporting or fixing the target substrate 740.

In an embodiment, the second frame 122 may be fixed or mounted on a movable unit (not directly shown). In this way, the second frame 122 may be moved and/or rotated along a corresponding direction according to design requirements.

In the embodiment, the target substrate 740 may include a corresponding circuit, and the circuit may include a corresponding pad 741 exposed to the outside. In an embodiment, the target substrate 740 may include a rigid circuit board or a flexible circuit board, but the disclosure is not limited thereto. In an embodiment, the target substrate 740 may be a circuit board (such as, but not limited to, a thin film transistor array substrate) further including an active element.

In an embodiment, the pad 741 may be adapted to have solder disposed thereon (but not limited to). Therefore, the pad 741 may also be referred to as a bonding pad.

In an unillustrated embodiment, the electronic component 720 may include a die similar to the die 728, and the target substrate 740 may have a corresponding conductive connection member similar to the conductive connection member 729.

A method for transferring the electronic component 720 from the flexible carrier 710 to the target substrate 740 through the electronic component transfer apparatus 100 may be described as below. It is worth noting that the disclosure is not limited to the method described below. In addition, for clarity, in some drawings below (e.g. FIG. 2 to FIG. 5), merely schematic cross-sectional side views of a portion of the components corresponding to an R1 area in FIG. 1 are illustrated for an illustrative purpose. In addition, for clarity, in some drawings below, some elements or components may be omitted (e.g. a corresponding gas pipe 141 or the corresponding signal wire 159).

Referring to FIG. 1, the apparatus 100 for transferring the electronic component is provided. Next, the following is performed in no particular order. The target substrate 740 is disposed on the second frame 122 of the apparatus 100 for transferring the electronic component, and the flexible carrier 710 with at least one electronic component 720 disposed thereon is disposed on the first frame 121. In addition, the electronic component 720 disposed on the flexible carrier 710 is disposed to face the target substrate 740 with a corresponding distance therebetween. It is worth noting that, in FIG. 1, the number and/or the configuration of the electronic components 720 disposed on the flexible carrier 710 is only illustrative, and is not limited in the disclosure. It is worth noting that, in FIG. 1, the method of disposing the target substrate 740 on the second frame 122 of the electronic component transfer apparatus 100 and/or the method of disposing the flexible carrier 710 on the first frame 121 are only illustrative, and are not limited in the disclosure.

Figure 2:
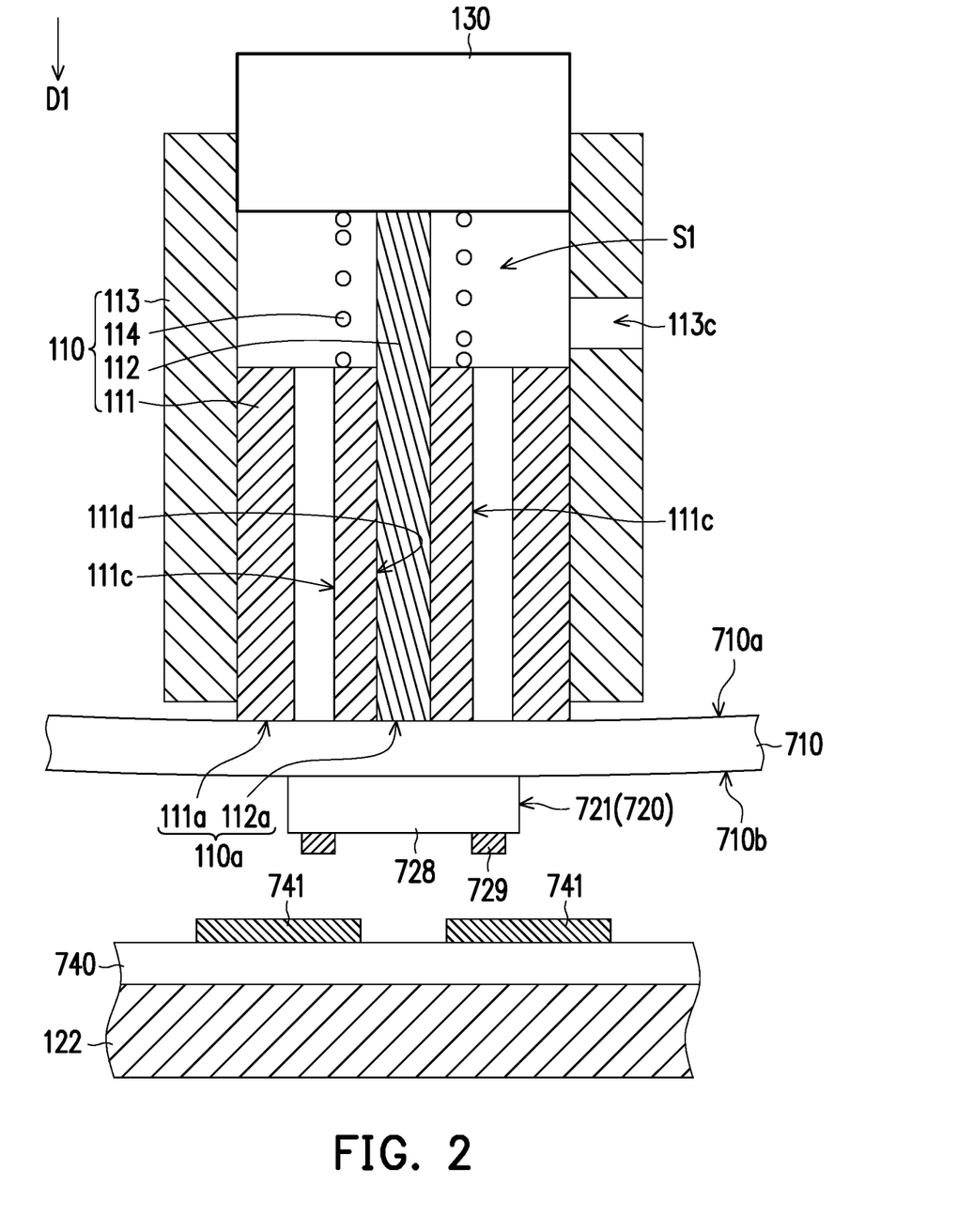
FIG. 2 to FIG. 5 are schematic partial cross-sectional side views of a portion of an action of an apparatus for transferring an electronic component according to an embodiment of the disclosure.

Referring to FIG. 1 to FIG. 2, the abutment module 110 of the electronic component transfer apparatus 100 approaches the flexible carrier 710 along an abutting direction D1 so that an abutting surface 110a of the abutment module 110 may further abut against a surface (e.g. the first surface 710a) of the flexible carrier 710 without carrying the electronic component 720. For example, a guide 111 and an abutting component 112 may be moved through the actuator 130 so that at least the abutting component 112 contacts the first surface 710a of the flexible carrier 710. In an embodiment, the abutting component 112 and the guide 111 may simultaneously or almost simultaneously contact the first surface 710a of the flexible carrier 710, but the disclosure is not limited thereto.

Referring to FIG. 2, the abutment module 110 may include the abutting component 112 and the guide 111. The guide 111 may guide a movement of the abutting component 112. The actuator 130 may directly and/or indirectly actuate the abutment module 110 so that the abutting component 112 and the guide 111 may be respectively moved from a start position of an abutment path.

For example, as shown in FIG. 2, the abutment module 110 may further include a shell (or referred to as an outer shell) 113. The abutting component 112 and the guide 111 may be sleeved in the shell 113. In addition, the abutting component 112 and the guide 111 may be moved in the shell 113. The guide 111 may be the same as or similar to a cap. The guide 112 may be the same as or similar to a pin. The abutting component 112 may be sleeved in the guide 111. In addition, the abutting component 112 may be moved in a guide passage 111d of the guide 111. The actuator 130 may directly and/or indirectly abut against the abutting component 112. The actuator 130 may indirectly abut against the guide 111 through an elastic mechanism 114. The guide 111 has a first abutting surface 111a, and the abutting component 112 has a second abutting surface 112a. The abutting surface 110a of the abutment module 110 at least includes the first abutting surface 111a and the second abutting surface 112a.

Figure 7:
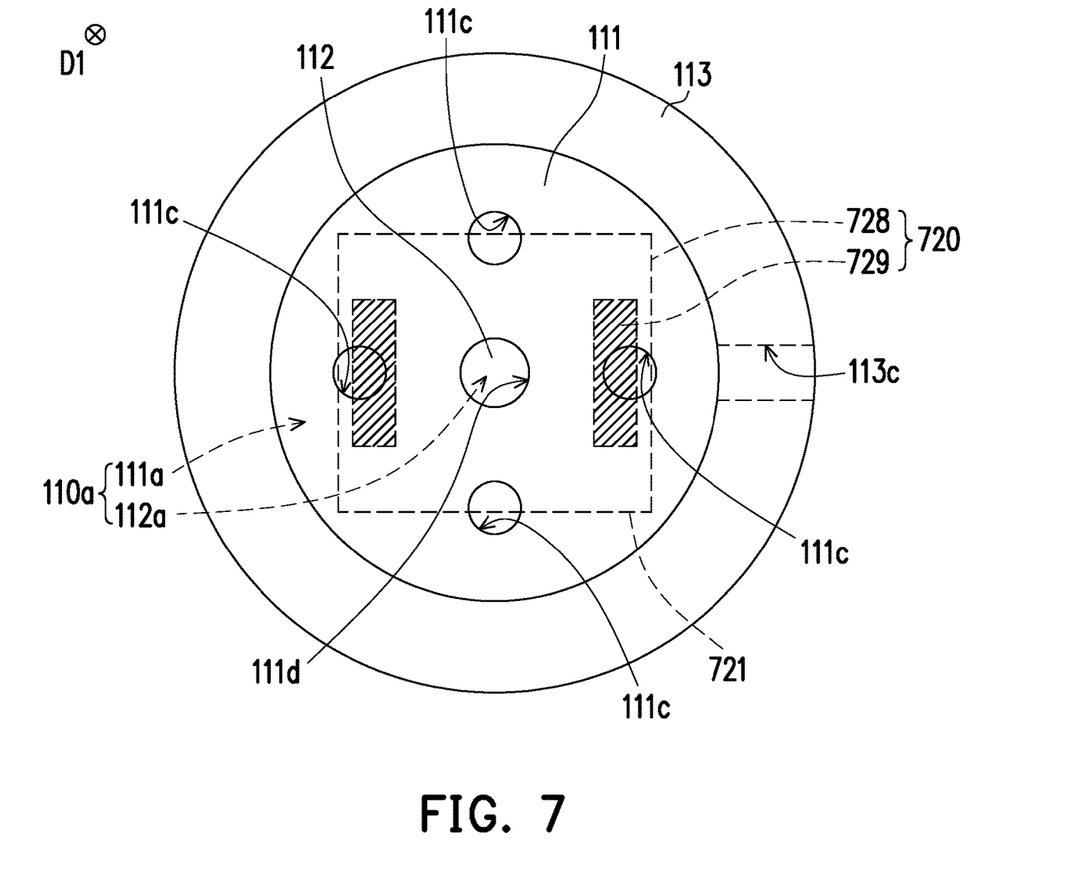
FIG. 7 is a schematic partial top view of a portion of an action of an apparatus for transferring an electronic component according to an embodiment of the disclosure.

FIG. 7 may be a schematic top view corresponding to FIG. 2. Referring to FIG. 7, viewing along a direction parallel to the abutting direction D1, an area of the first abutting surface 111a may be greater than an area of the second abutting surface 112a.

Referring to FIG. 7, projection of the abutting surface 110a on a projection surface (e.g. a virtual surface perpendicular to the abutting direction) is basically overlapped with projection of the electronic component 720 on the projection surface. In an embodiment, within a projection area of the abutting surface 110a on the projection surface, the abutting surface 110a basically corresponds to merely the specific electronic component 720 (e.g. an electronic component 721 corresponding to the abutment module 110 in FIG. 1 to FIG. 5 and FIG. 7). Accordingly, the transferring accuracy and precision may be enhanced, and/or chances of transferring errors (e.g. transferring other electronic component adjacent to the electronic component 721 altogether) may be reduced.

In the embodiment, as shown in FIG. 7, an outer edge of the shell 113 may be a circle, but the disclosure is not limited thereto. In the embodiment, as shown in FIG. 7, an inner edge of the shell 113 and an outer edge of the guide 111 may be a circle, but the disclosure is not limited thereto. In the embodiment, as shown in FIG. 7, a guide passage 111d of the guide 111 and an outer edge of the abutting component 112 may be a circle, but the disclosure is not limited thereto.

Figure 3:
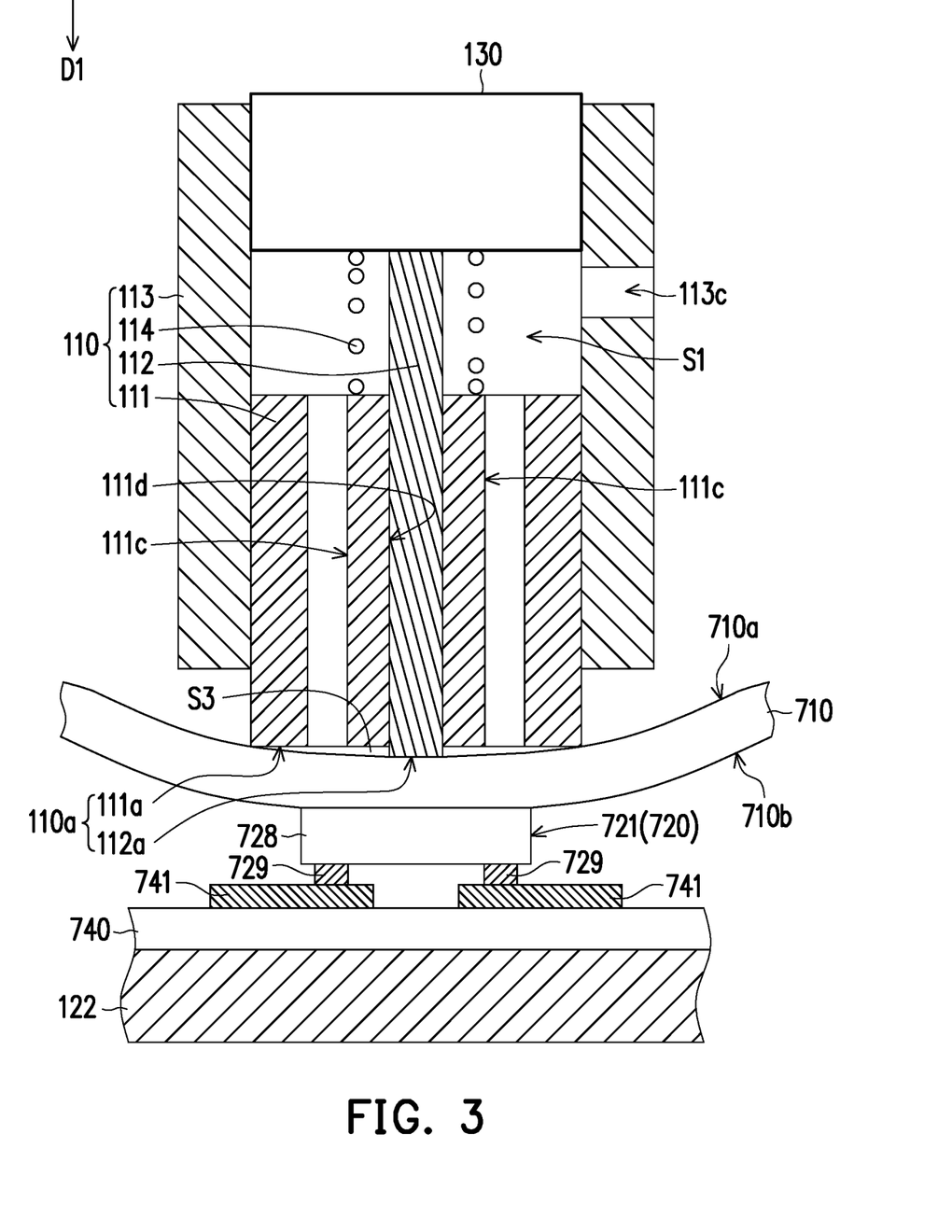

Referring to FIG. 2 to FIG. 3, through the abutment of the abutment module 110, the abutting component 112 and the guide 111 may at least be moved to an end position of the abutment path, and the electronic component 721 may abut against the target substrate 740.

In the embodiment, as shown in FIG. 3, the abutting component 112 and the guide 111 may simultaneously contact the first surface 710a of the flexible carrier 710. Accordingly, shift of the electronic component 720 may be reduced, and/or a stressed area of the flexible carrier 710 and/or a stressed area of the electronic component 720 may be increased. Hence, chances of damaging the flexible carrier 710 and/or the electronic component 720 may be reduced.

In an embodiment, when the abutment module 110 contacts the first surface 710a of the flexible carrier 710 so that the electronic component 721 abuts against the target substrate 740, the first abutting surface 111a of the guide 111 may partially contact the first surface 710a of the flexible carrier 710. Taking FIG. 3 as an example, a space S3 may be formed between the flexible carrier 710 and the first abutting surface 111a due to (but not limited to) bending of the flexible carrier 710.

In an embodiment, after the electronic component 721 abuts against the target substrate 740, the electronic component 721 may be soldered and fixed on the target substrate 740 in an appropriate manner (such as, but not limited to, heating).

Figure 4:
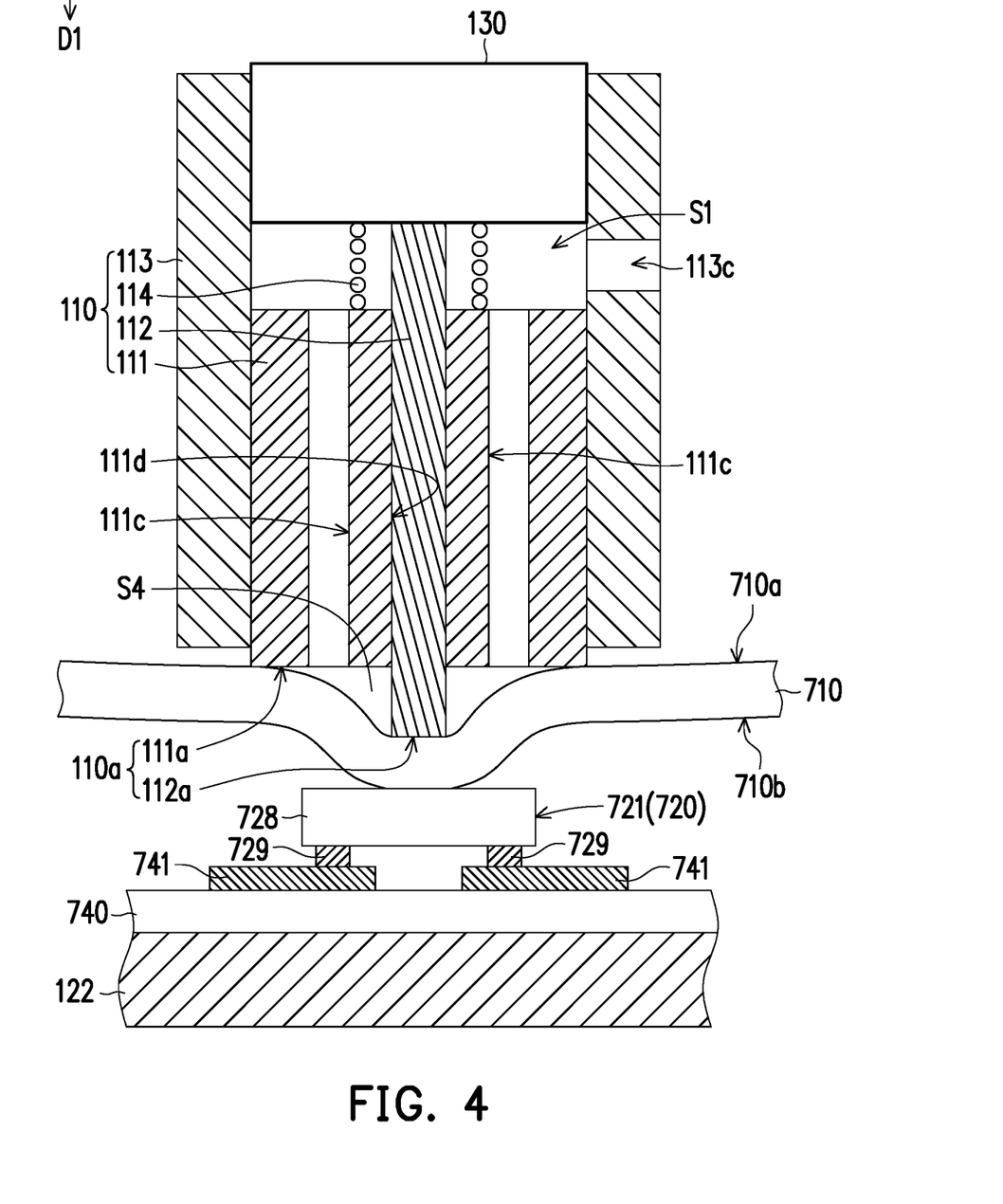

Referring to FIG. 3 to FIG. 4, a negative pressure may be generated between the first surface 710a of the flexible carrier 710 and the first abutting surface 111a, and the guide 111 may be moved in a direction away from the flexible carrier 710.

For example, in the shell 113, a gas cell S1 may be formed between the actuator 130 and the guide 111. The guide 111 has a gas passage 111c connected to the gas cell S1. The shell 113 has a gas passage 113c connected to the gas cell S1.

The negative pressure generating device 140 may be pumped through the gas pipe 141 connected to the gas passage 113*c* so that the air pressure in the gas cell S1 is reduced to be pumped through the gas passage 111*c* of the guide 111. Accordingly, a negative pressure may be generated in a space S4 between the first surface 710*a* of the flexible carrier 710 and the first abutting surface 111*a* (i.e. the air pressure is less than the ambient pressure). That is, the air pressure of the gas cell S1 and/or the air pressure of the space S4 in FIG. 4 is basically less than the air pressure of the gas cell S1 and/or the pressure of the space S3 in FIG. 3.

In an embodiment, the elastic mechanism 114 may include a passive elastic member (such as, but not limited to, a spring or an O-ring). Accordingly, at the same time when the negative pressure is generated in the space between the first surface 710*a* of the flexible carrier 710 and the first abutting surface 111*a* through the pumping method above, the guide 111 may be moved in the direction away from the flexible carrier 710 due to a pressure difference.

In an embodiment, the elastic mechanism 114 may include an active elastic member (such as, an actuating member). At the same time when or after the negative pressure is generated in the space between the first surface 710*a* of the flexible carrier 710 and the first abutting surface 111*a* through the pumping method above, the guide 111 may be moved in a direction away from the target substrate 740 through adjustment of the active elastic member at an appropriating timing.

The negative pressure is generated between the first surface 710*a* of the flexible carrier 710 and the first abutting surface 111*a*. When the guide 111 is moved in the direction away from the flexible carrier 710, the abutting component 112 may be actuated by the actuator 130 so that the second abutting surface 112*a* of the abutting component 112 still abuts against the first surface 710*a* of the flexible carrier 710. In addition, the electronic component 721 may still be located on a portion corresponding to the second abutting surface 112*a* in the second surface 710*b*, and the other portion corresponding to the first abutting surface 111*a* in the second surface 710*b* may be separated from the electronic component 721 due to a pressure difference.

In the embodiment, it may be referred to as a first stage separation that the flexible carrier 710 and the electronic component 721 are partially separated through the method above.

Figure 5:
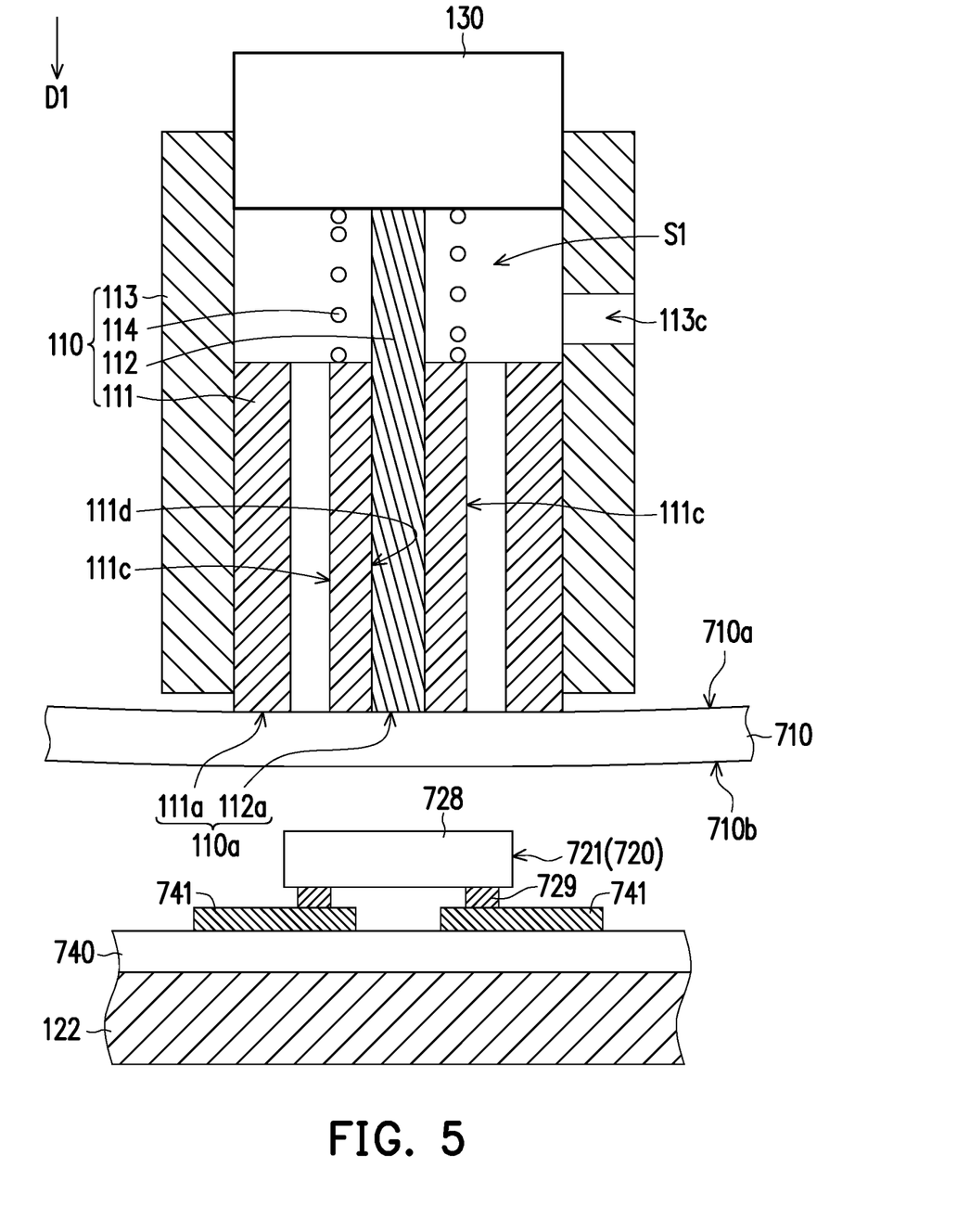

Referring to FIG. 4 to FIG. 5, after the first stage separation is completed, the abutting component 112 may be actuated by the actuator 130 to be moved in the direction away from the target substrate 740.

In an embodiment, when or after the abutment element 112 is moved in the direction away from the target substrate 740, the flexible carrier 710 may be restored to its original shape through its own elasticity/deflection as shown in FIG. 5 and be completely separated from the electronic component 721.

In an embodiment, when or after the abutment element 112 is moved in the direction away from the target substrate 740, the negative pressure may still be generated between the first surface 710*a* of the flexible carrier 710 and the abutting surface 110*a* through the pumping method above, and the flexible carrier 710 may be restored to its original shape as shown in FIG. 5 and be completely separated from the electronic component 721.

In the embodiment, it may be referred to as a second stage separation that the flexible carrier 710 and the electronic component 721 are completely separated from each other through the method above.

In the embodiment, through the two-stage separation method above (i.e. the first stage separation and the second stage separation), the flexible carrier 710 may be more easily or completely separated from the electronic component 721, and/or when the flexible carrier 710 is separated from the electronic component 721, chances that the electronic component 721 and the target substrate 740 are separated from each other or shift may be reduced.

Figure 6:
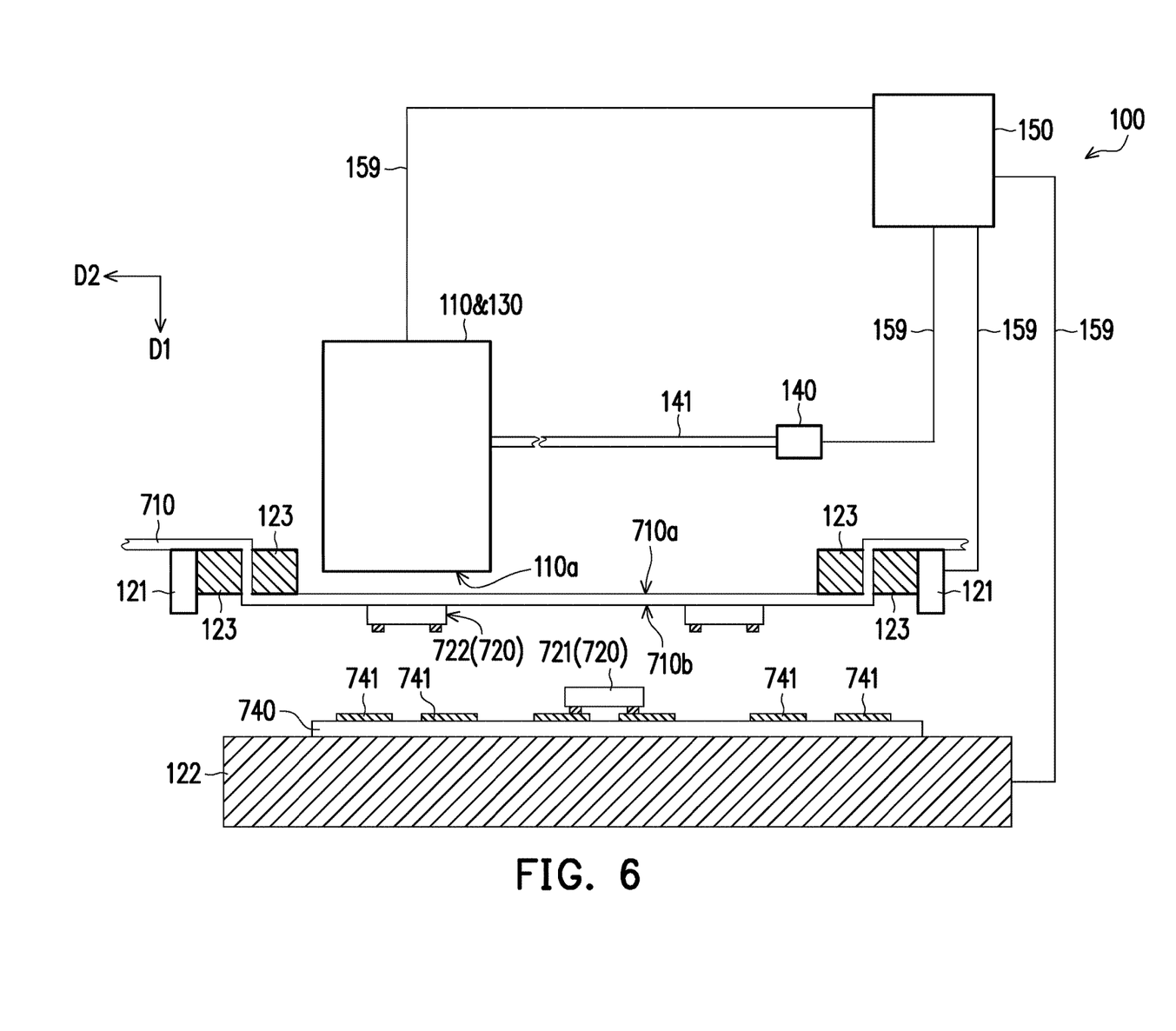
FIG. 6 is a schematic partial side view of a portion of an action of an apparatus for transferring an electronic component according to an embodiment of the disclosure.

Referring to FIG. 5 to FIG. 6, after the electronic component 721 is well transferred to the target substrate 740, the first frame 121, the second frame 122, the abutment module 110, and/or the actuator 130 may be moved along an appropriate direction (e.g. a direction D2 perpendicular to the abutting direction D1) so that another electronic component 722 (another one that is different from the specific electronic component 721 among the electronic components 720) may be transferred by using the same or similar method.

In an embodiment, the abutment module 110 and/or the actuator 130 may be fixed or mounted on a movable unit (not shown). Accordingly, the abutment module 110 and/or the actuator 130 may be moved and/or rotated along a corresponding direction according to design requirements (as shown in FIG. 6, but not limited thereto) through a movable module (e.g., a horizontal movement module, a vertical movement module, a rotary movement module, or a combination of the above) in a movable mechanism.

The method for transferring the electronic component of the embodiments may be adapted to any suitable manufacturing process of an electronic device. For example, the electronic component 720 may include a light-emitting diode chip, and the transferring method above may be a portion of a manufacturing process of a light-emitting diode panel.

In summary of the above, the apparatus for transferring the electronic component and the method for transferring the electronic component of the disclosure are configured to transfer the electronic component on the flexible carrier to the target substrate.

What is claimed is:

1. A method for transferring an electronic component, the method comprising:
    providing a flexible carrier, wherein an electronic component is carried on a surface of the flexible carrier;
    providing a target substrate;
    causing the surface of the flexible carrier with the electronic component to be disposed opposite to the target substrate;
    providing a first abutting surface and a second abutting surface respectively moving toward a surface of the flexible carrier without carrying the electronic component, wherein an area of the first abutting surface is greater than an area of the second abutting surface;
    moving the first abutting surface and the second abutting surface so that at least the second abutting surface contacts the surface of the flexible carrier without carrying the electronic component, wherein the electronic component abuts against the target substrate, and a space is formed between the flexible carrier and the first abutting surface;
    a negative pressure is generated in the space; and
    causing the second abutting surface to leave the flexible carrier.

2. The method for transferring the electronic component according to claim 1, wherein the first abutting surface and the second abutting surface simultaneously contact the flexible carrier, the electronic component abuts against the target substrate, and the first abutting surface leaves the flexible carrier first.

3. The method for transferring the electronic component according to claim 1, wherein the second abutting surface leaves the flexible carrier at the same time when the negative pressure is generated.

4. A manufacturing method of a light-emitting diode panel, the method comprising using the method according to claim 1 to transfer a light-emitting diode to a panel.

\* \* \* \* \*